(12) United States Patent
Eilmsteiner et al.

(10) Patent No.: US 9,766,546 B2
(45) Date of Patent: Sep. 19, 2017

(54) METHOD OF PRODUCING A RESIST STRUCTURE WITH UNDERCUT SIDEWALL

(71) Applicant: ams AG, Unterpremstaetten (AT)

(72) Inventors: Gerhard Eilmsteiner, Leoben (AT); Raimund Hoffmann, Soeding (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/910,670

(22) PCT Filed: Jul. 25, 2014

(86) PCT No.: PCT/EP2014/066081
§ 371 (c)(1),
(2) Date: Feb. 5, 2016

(87) PCT Pub. No.: WO2015/018672
PCT Pub. Date: Feb. 12, 2015

(65) Prior Publication Data
US 2016/0179009 A1   Jun. 23, 2016

(30) Foreign Application Priority Data
Aug. 6, 2013 (EP) .................... 13179420

(51) Int. Cl.
*G03F 7/20* (2006.01)
*G03F 1/54* (2012.01)
(Continued)

(52) U.S. Cl.
CPC ............. *G03F 7/2022* (2013.01); *G03F 1/50* (2013.01); *G03F 1/54* (2013.01); *G03F 7/168* (2013.01); *G03F 7/20* (2013.01); *G03F 7/32* (2013.01)

(58) Field of Classification Search
CPC ........................................................ G03F 7/26
See application file for complete search history.

(56) References Cited

U.S. PATENT DOCUMENTS

| 4,024,293 A | 5/1977 | Hatzakis |
|---|---|---|
| 4,104,070 A | 8/1978 | Moritz et al. |

(Continued)

FOREIGN PATENT DOCUMENTS

| JP | S60135949 A | 7/1985 |
|---|---|---|
| JP | S61156044 A | 7/1986 |
| KR | 1020050069755 | 7/2005 |

OTHER PUBLICATIONS

Chew, M. et al.: "Development of Negative Profile of Dry Film Resist for Metal Lift Off Process", 2009 11th Electronics Packaging Technology Conference, Dec. 9, 2009, pp. 884-888.

(Continued)

*Primary Examiner* — Kathleen Duda
(74) *Attorney, Agent, or Firm* — McDermott Will & Emery LLP

(57) ABSTRACT

The method comprises the steps of applying a layer of a negative photoresist on a bottom layer, providing the layer of the negative photoresist with a pattern arranged in a border zone of the resist structure to be produced, irradiating a surface area of the layer of the negative photoresist according to the resist structure to be produced, and removing the layer of the negative photoresist outside the irradiated surface area. The pattern is produced in such a manner that it comprises a dimension that is smaller than a minimal resolution of the irradiation. The pattern may especially be designed as a sub-resolution assist feature.

12 Claims, 2 Drawing Sheets

(51) Int. Cl.
G03F 7/32 (2006.01)
G03F 7/16 (2006.01)
G03F 1/50 (2012.01)

(56) References Cited

U.S. PATENT DOCUMENTS

| | | | |
|---|---|---|---|
| 4,564,584 | A | 1/1986 | Fredericks et al. |
| 5,654,128 | A | 8/1997 | Hsu |
| 5,698,377 | A | 12/1997 | Seino |
| 6,071,652 | A * | 6/2000 | Feldman ............ G02B 3/0012 430/5 |
| 6,335,151 | B1 | 1/2002 | Ausschnitt et al. |
| 7,141,338 | B2 | 11/2006 | Chen et al. |
| 7,694,269 | B2 | 4/2010 | Savithri et al. |

OTHER PUBLICATIONS

Feely, W.E.: "Microplastic Structures", SPIE vol. 631 Advances in Resist Technology and Processing, 1986, pp. 48-61.

Flack, W.W. et al.: "Highly Re-entrant Profiles in a Thick Photosensitive Material for Nanotechnology Applications", Proceedings of SPIE, vol. 6153, Mar. 9, 2006, pp. 615341-1-615341-10.

Lee, H.S. et al: "A simple and effective lift-off with positive photoresist", Journal of Micromechanics and Microengineering, vol. 15, No. 11, Nov. 1, 2005, pp. 2136-2140.

Lee, Y.H. et al.: "Fine Tuning of Negative Photoresists Sidewall Profiles for Thick Metal Lift-off in Applications of MEMS and Advanced Packaging", 2010 12th Electronics Packaging Technology Conference, Dec. 2010, pp. 338-342.

Wang, J. et al.: "Bimetallic Thin Film Grayscale Photomasks for Complex 3D Microstructure Creation in SU-8", Canadian Conference on Electrical and Computer Engineering, Apr. 1, 2007, IEEE, PI, pp. 959-962.

* cited by examiner

METHOD OF PRODUCING A RESIST STRUCTURE WITH UNDERCUT SIDEWALL

BACKGROUND OF THE INVENTION

In semiconductor technology photolithography is applied to structure a photoresist layer to be used as a mask. The photoresist layer is irradiated by a light source through openings in an opaque mask, which are shaped according to the pattern that is to be transferred to the photoresist layer. The photoresist is then treated with a developer solution. When a positive photoresist is used, the developer dissolves and removes the regions of the photoresist that have been exposed to light. When a negative photoresist is used, the developer dissolves and removes the regions of the photoresist that have not been exposed to light.

The absorption of incident light by a layer of negative photoresist decreases exponentially with the distance from the layer surface and does practically not change during the illumination. As the solubility of the negative photoresist is reduced according to the dose of radiation absorbed, the illumination yields a vertical profile of the solubility, which increases with increasing distance from the layer surface. The developer that is subsequently applied dissolves the entire region of the negative photoresist that has not been illuminated together with a lower layer portion of the illuminated region, whereas the photoresist is not dissolved at the surface of the illuminated region. An undercut is thus produced in the sidewall of the remaining photoresist structure. Negative photoresist is therefore especially suitable to produce structures with overhanging upper edges and with a reentrant sidewall profile.

The shape of the undercut depends on parameters of the developing process, in particular its duration and the temperature and amount of the developer, which can be controlled during the process. A minimal developing time is required to remove the photoresist completely from the area that has not been illuminated, which is the reason for a minimal size of the sidewall undercut. Furthermore, the developing progress is different for dense and isolated structures, and the sizes of the respective undercuts will differ correspondingly. Another problem arises from the fact that the insoluble upper layer portion rests on a relatively soft and thermally instable lower layer portion of the photoresist, which may later cause a degradation of the intended pattern under elevated temperatures, unless the whole photoresist layer is stabilized by a flood exposure.

Lift-off methods are applied to produce a structured layer, especially a structured metal layer, on a surface of a semiconductor device. Regions of the surface that are not to be occupied by the structured layer are covered with a sacrificial layer. An entire metal layer is applied on the bare areas of the surface and on the sacrificial layer, which is subsequently removed together with the overlying portion of the metal. After this lift-off, the remaining metal forms the structured layer. For this method to be feasible, the portion of the metal overlying the sacrificial layer must be separable from the rest of the metal layer. This is facilitated by an overhanging flank with a sharp upper edge of the sacrificial layer, so that the undercut sidewall of the sacrificial layer has a reentrant profile with negative slope. A conformal deposition of the metal is prevented by the sharp edge, where the metal layer is interrupted.

U.S. Pat. No. 4,024,293 A discloses a high sensitivity electron resist system for lift-off metallization. Resist films are formed by at least two layers of different radiation degradable organic polymers, which are developable by different solvents. One of the layers comprises a co-polymer of polymethyl methacrylate (PMMA) and methacrylic acid (MAA). The other layer is pure polymethyl methacrylate. The developer used for one of the layers does not attack the other layer even in areas that have been exposed to high-energy radiation, and vice versa.

U.S. Pat. No. 4,104,070 A discloses a method of making a negative photoresist image. A photoresist layer containing 1-hydroxyethyl-2-alkyl-imidazoline is exposed to actinic radiation according to the pattern to be produced. The photoresist is heated and subjected to a blanket exposure to actinic radiation. The portion of the photoresist that had not already been exposed previously is then removed with a solvent to yield a negative image.

U.S. Pat. No. 4,564,584 A discloses a photoresist lift-off process for fabricating self-aligned structures in semiconductor devices. A layer of a negative photoresist is applied on a structured layer of a positive photoresist. The entire structure is exposed to light, and the negative photoresist is thus rendered insoluble. Since the upper photoresist layer is at least translucent to the light, the remaining portions of the positive photoresist become soluble. They are removed together with the overlying portions of the negative photoresist. The remaining portions of the negative photoresist form a structured photoresist mask. This method provides a complete, mutually self-aligned image reversal of the patterns of the first and second photoresist layers.

U.S. Pat. No. 5,654,128 A discloses a single resist layer lift-off process for forming patterned layers on a substrate. The extent of the penetration of chlorobenzene into the resist layer is controlled by a post-soak bake. A post-metallization bake is employed to improve lift-off. The resist profile is provided with an increased overhang length and a negative slope of the sidewalls in order to prevent the sidewalls of the resist from being metallized and to facilitate the removal of the resist by lift-off.

U.S. Pat. No. 7,141,338 B2 discloses sub-resolution assist features (SRAF). In an image printed on a substrate, corner rounding and image shortening is reduced by illuminating a photolithographic mask and projecting light transmitted through the mask onto the substrate using an optical projection system. The mask has a pattern that includes at least one printable feature having at least one corner. A line feature is incorporated in the mask pattern in close proximity to a corresponding corner of the printable feature and has a line width that is smaller than a minimum resolution of the optical projection system.

U.S. Pat. No. 7,694,269 B2 discloses a method for selectively positioning sub-resolution assist features (SRAF) in a photomask pattern for an interconnect. The method comprises determining if a first interconnect pattern option, which is designed to be formed with SRAF, will yield a better circuit performance than a second interconnect pattern option, which is designed to be formed without SRAF. If the first option is preferred, one or more SRAF patterns are positioned to facilitate patterning. Otherwise the second option is selected as a target pattern and no SRAF is provided.

SUMMARY OF THE INVENTION

The method for producing a resist structure allows the formation of a three-dimensional structure of negative photoresist by an implementation of layout-features below the resolution limit of the imaging system that is used for the irradiation of the photoresist.

The method comprises the steps of applying a layer of a negative photoresist on a bottom layer, providing the layer of the negative photoresist with a pattern arranged in a border zone of the resist structure to be produced, irradiating a surface area of the layer of the negative photoresist according to the resist structure to be produced, and removing the layer of the negative photoresist outside the irradiated surface area. The pattern is produced in such a manner that it comprises a dimension or structural feature that is smaller than a minimal resolution of the irradiation. The pattern may especially be provided as a sub-resolution assist feature. The pattern is formed within the layer of the negative photoresist.

In a variant of the method, at least one dimension characterizing the pattern is smaller than one tenth of a width of the border zone.

In a further variant of the method, the pattern is produced such that it comprises a plurality of elements having the same dimensions.

In a further variant of the method, the pattern is produced such that it comprises a plurality of elements having the same dimensions, which are smaller than one tenth of a width of the border zone.

In a further variant of the method, the elements of the pattern are arranged in a regular array with constant pitch.

In a further variant of the method, the elements of the pattern are arranged in a regular array with a constant pitch, which is smaller than one tenth of a width of the border zone.

In further variants of the method, the pattern is a gridlike pattern, a pattern of parallel lines or a pattern of contact holes.

The method can especially be applied to produce a resist structure with an undercut sidewall formed in the region of the border zone, in particular a resist structure that is provided as a lift-off mask.

The following is a detailed description of examples of the method in conjunction with the appended figures.

DETAILED DESCRIPTION

Figure 1:
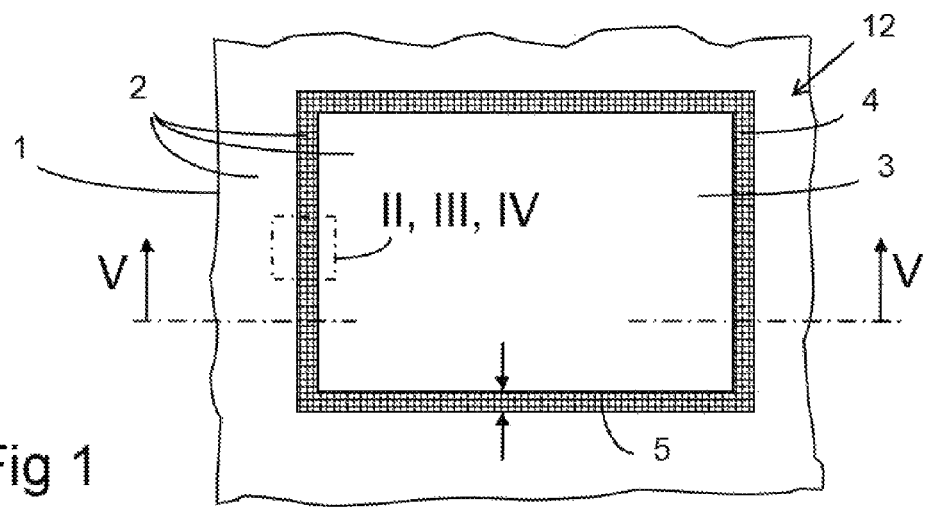
FIG. 1 is a top view of a layer of negative photoresist indicating the location of the resist structure to be produced.

FIG. 1 is a top view of a surface 12 of a layer of negative photoresist 2, which is applied on a bottom layer 1. A resist structure 3 that is to be produced from the negative photoresist is indicated in FIG. 1 by a rectangular area. The area of the resist structure 3 may instead comprise any other shape or pattern according to individual requirements, in particular a triangle, a polygon having more than four corners, a circle or an ellipse. The resist structure 3 may comprise a plurality of areas of such shapes, which may be similar or different from one another and may be arranged at equal or different distances from one another. The resist structure 3 may especially be intended as a lift-off mask, which will be used to structure a layer that is deposited on the lift-off mask. The bottom layer 1 may be a semiconductor substrate or wafer, for instance, or a layer that is arranged on or above a substrate. The resist structure 3 that is to be produced from the negative photoresist is surrounded by a border zone 4 within the layer of negative photoresist 2. A width 14 of the border zone 4 is indicated in FIG. 1 by arrows.

The border zone 4 is provided with a pattern 5 comprising a dimension that is smaller than a minimal resolution of the irradiation that is intended to produce a locally selective insolubility of the negative photoresist. The pattern 5 is provided to modify the intensity of the radiation reaching different levels below the surface 12 and hence to modify the vertical profile of the solubility of the negative photoresist within the border zone 4 as compared to the vertical profile of the solubility in the centre of the resist structure 3. The pattern 5 is formed within the layer of the negative photoresist 2.

Figure 2:
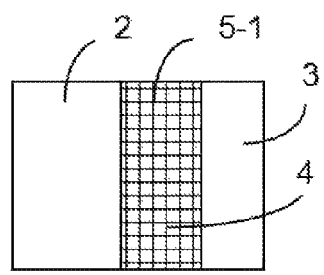
FIG. 2 is a magnified view of the section indicated in FIG. 1 for a variant using a grid-like pattern arranged in a border zone of the resist structure.

FIG. 2 is a magnified view of the section indicated in FIG. 1 by a dash-dotted contour. The section according to FIG. 2 shows an area of the border zone 4 between adjacent areas of the layer of negative photoresist 2, including an area of the resist structure 3 to be produced. The border zone 4 is provided with a pattern 5. In the example shown in FIG. 2, the pattern 5 is a grid-like pattern 5-1 composed of two pluralities of parallel lines, wherein the lines belonging to one of the pluralities are arranged transverse to the lines belonging to the other plurality. The distances between the parallel lines may be typically in the range from 100 nm to 700 nm and may especially be constant, thus forming a grid with constant pitch. A typical example for a suitable pitch is 400 nm in both directions.

Figure 3:
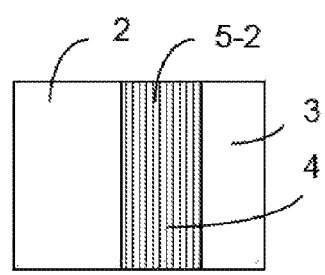
FIG. 3 is a magnified view according to FIG. 2 for a further variant using a pattern of parallel lines.

FIG. 3 is a further magnified view of the section indicated in FIG. 1 by a dash-dotted contour, the corresponding areas being designated with the same reference numerals. In the example shown in FIG. 3, the pattern 5 is a pattern of parallel lines 5-2. The distances between the parallel lines may be typically in the range from 100 nm to 700 nm and may especially be constant, thus forming an array with constant pitch. A typical example for a suitable pitch is 400 nm.

Figure 4:
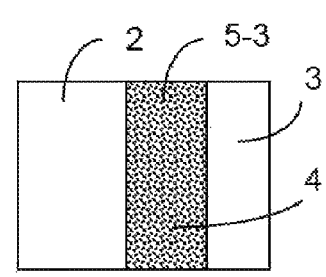
FIG. 4 is a magnified view according to FIG. 2 for a further variant using a pattern of contact holes.

FIG. 4 is still a further magnified view of the section indicated in FIG. 1 by a dash-dotted contour, the corresponding areas being designated with the same reference numerals. In the example shown in FIG. 4, the pattern 5 is a pattern of contact holes 5-3. The holes are not provided for contacts, but they can be shaped and produced in a way that is similar to the formation of small via holes. The holes may be arranged in a random distribution, or they may be arranged on a regular pattern at equal intervals. Such a regular pattern may typically comprise a pitch in the range from 100 nm to 700 nm, which may especially be constant. The diameters of the holes may typically be in the range from 200 nm to 400 nm and may be different or equal.

Figure 5:
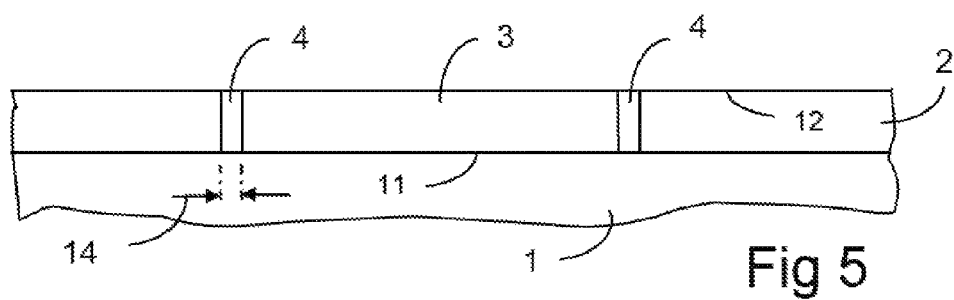
FIG. 5 is a cross section showing a layer of negative photoresist on a bottom layer.

FIG. 5 is a cross section showing the layer of negative photoresist 2 on the upper surface 11 of the bottom layer 1. The position of this cross section is indicated in FIG. 1 by the dash-dotted straight lines. FIG. 5 shows the region of the resist structure 3 to be produced and the border zone 4, which surrounds the resist structure 3 and is therefore present at both lateral boundaries of the resist structure 3. The width 14 of the border zone 4 is again indicated by arrows. The layer of negative photoresist 2 is irradiated, in particular illuminated by light that is incident on the upper surface 12.

The pattern 5 of the border zone 4 is optionally designed like a sub-resolution assist feature (SRAF). Contrary to conventional sub-resolution assist features, the pattern 5 is used in a completely different way for the formation of the resist structure 3, in particular by an illumination with a conventional imaging system like a stepper, for instance. The dimensions of the resist structure 3 are larger than the resolution limit of the imaging system. The pattern 5 comprises a dimension or a structural feature that is smaller than the resolution limit of the imaging system. Because of the different dimensions, the structure of the pattern 5 is not reproduced in detail, but only the general outline of the resist structure 3 is transferred to the layer of negative photoresist 2. The porosity or the voids of the pattern 5 allow a larger radiation dose to reach a certain level below the surface 12 and thus to cross-link and harden the negative photoresist in the border zone 4 down to deeper levels below the surface 12 than in the central region surrounded by the border zone 4. The region where the sidewall of the resist structure 3 will be located is thus modified.

The radiation intensity in the vertical direction through the layer of negative photoresist 2 is controlled in the border zone 4 by setting the relevant dimensions of the pattern 5 to appropriate values. In the example of the pattern of contact holes 5-3, the diameter of the holes and the pitch of their array, for instance, are relevant parameters that can be adapted. During the irradiation of the negative photoresist, the radiation dose should be set to be sufficiently high to secure a full cross-linking of the negative photoresist in the border zone 4 down to the bottom layer 1. If a full cross-linking is thus achieved in the border zone 4, the subsequent developing process will stop exactly at the position where the negative photoresist is thoroughly cross-linked down to the bottom layer 1, independently of the amount of developer employed. Therefore the shape and size of the sidewall undercut can be adapted to the requirements of individual applications by setting the relevant parameters, especially the width 14 of the border zone 4.

Figure 6:
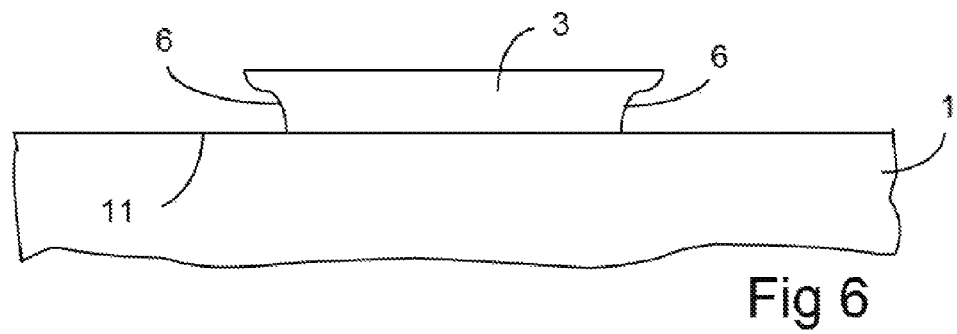
FIG. 6 is a cross section according to FIG. 5 after the formation of the resist structure.

FIG. 6 is a cross section according to FIG. 5 after the formation of the resist structure 3 with an overhanging sidewall 6. Other profiles of the sidewall 6, like the one shown in FIG. 8, can also be produced by adapting the width 14 of the border zone 4 and the structure of the pattern 5. The upper edge of the resist structure 3 overhangs the upper surface 11 of the bottom layer 1, and the reentrant shape of the sidewall 6 is appropriate for an application of the resist structure 3 as a lift-off mask.

Figure 7:
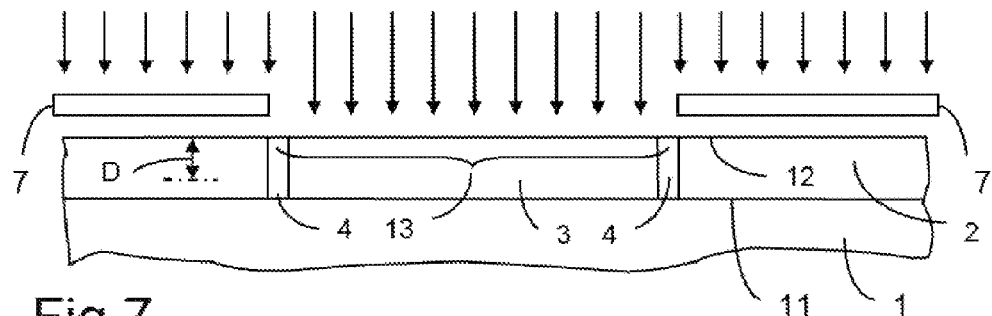
FIG. 7 is a cross section according to FIG. 5 showing the irradiation of the photoresist layer.

FIG. 7 is a cross section according to FIG. 5 showing the irradiation of the layer of negative photoresist 2. The layer of negative photoresist 2 is shielded against the radiation by a mask 7 covering the region outside the surface area 13 where the resist structure 3 is to be produced. The radiation is indicated in FIG. 7 by the arrows pointing down. Below the uncovered surface area 13, the radiation penetrates into the negative photoresist. The radiation intensity is a function of the distance D from the surface 12 and decreases with increasing distance D. The irradiation may be performed in such a way as to render the negative photoresist insoluble in the border zone 4 down to the bottom layer 1.

Figure 8:
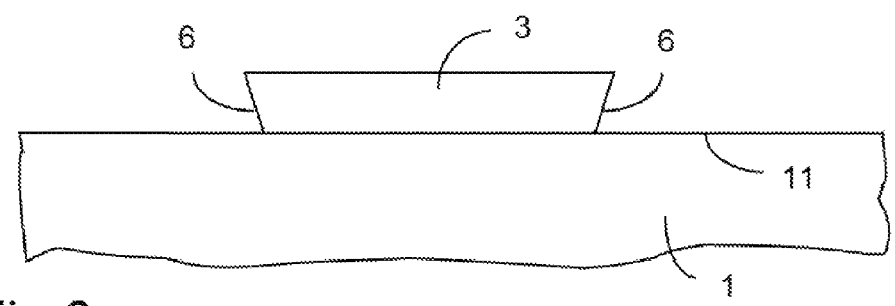
FIG. 8 is a cross section according to FIG. 6 for a further example.

FIG. 8 is a cross section according to FIG. 6, which shows the produced resist structure 3 after the developing process and after the removal of that portion of the layer of negative photoresist 2 that has not been irradiated. In the example shown in FIG. 8, the negative slope of the sidewall 6 is essentially at a constant angle with the plane of the surface 11. The resist structure 3 according to FIG. 8 is also appropriate for an application as a lift-off mask.

A constant slope of the sidewall 6 can be produced by adopting a suitable pattern 5. In the example of FIG. 4, using a pattern of contact holes 5-3, the diameters of the contact holes can be varied in the direction across the border zone 4, i. e. in the direction following one of the small arrows inserted in FIG. 1, so that the translucency of the pattern 5 comprises a gradient in that direction. In other examples in which the pattern 5 comprises a plurality of lines running parallel to the boundary of the border zone 4, the distances between the lines can be varied accordingly.

Figure 9:
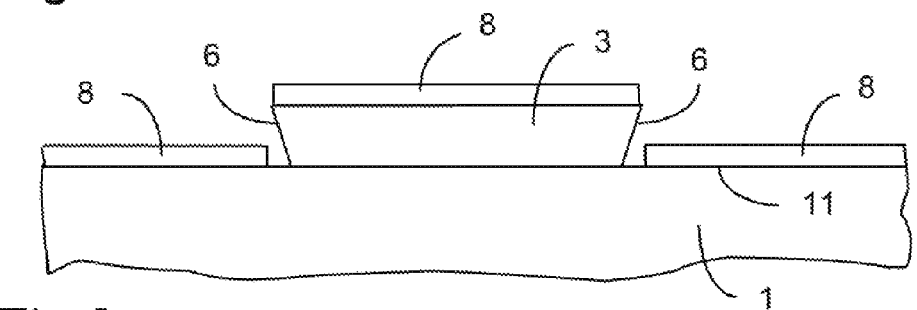
FIG. 9 is a cross section according to FIG. 8 after an application of a functional layer.
Figure 10:
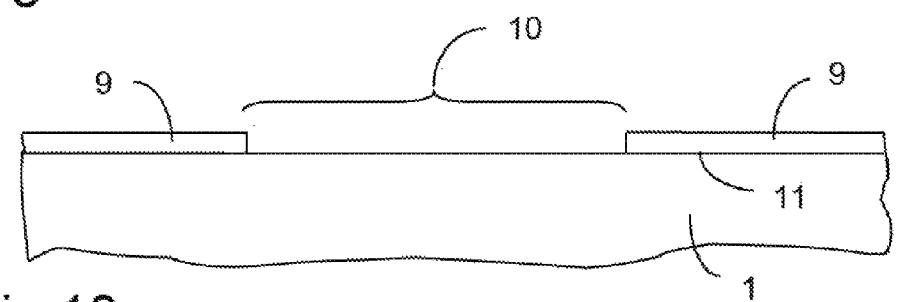
FIG. 10 is a cross section according to FIG. 9 after a partial removal of the functional layer by lift-off.

FIGS. 9 and 10 illustrate a lift-off process using the resist structure 3. A layer 8, which may be provided for a function of a semiconductor device and will therefore be designated as functional layer 8 in the following, is applied covering the entire surface 11. As the sidewall 6 of the resist structure 3 is undercut, the functional layer 8 is not deposited conformally at the sidewall 6, but is interrupted at the sharp upper edge, thus forming a gap. The portion of the functional layer 8 that is applied on the resist structure 3 can therefore easily be removed by removing the resist structure 3, without affecting the remaining portion 9, as shown in FIG. 10.

The described method uses only negative photoresist, which has an excellent temperature stability, and avoids the disadvantages of producing a double resist layer. In this method the shape of the undercut sidewall does not depend as much on the developing process as in conventional photolithographic methods. The thorough cross-linking in the region of the sidewall facilitates the control of the undercut and allows narrower design rules than heretofore. Since the attack of the developer is inhibited at the position where the resist is cross-linked down to the bottom layer, the developing process can be performed until the resist is completely removed from the surface area outside the resist structure without affecting the undercut. Furthermore, there is no restriction with respect to a minimal size of the undercut. These properties allow the sidewall of the resist structure to be easily adapted to any existing topographies. Pattern effects are minimized, and the developing process can be extended to avoid scumming in open surface areas and sticking of subsequently deposited layers.

The method is not limited to T-shaped sidewall profiles. By varying the pattern in the border zone, the areal image intensity can be modified to meet the requirements of a specific application, and vertical reentrant structures can be produced that cannot be realized with conventional methods. Feature degradation due to thermal treatment is low, because only cross-linked portions of the photoresist remain after developing, and no stabilizing flood exposure will be necessary.

The invention claimed is:
1. A method of producing a resist structure, comprising:
applying a layer of a negative photoresist on a bottom layer;
irradiating a surface area of the layer of the negative photoresist according to the resist structure to be produced; and
removing the layer of the negative photoresist outside the irradiated surface area, thus forming the resist structure, wherein the layer of the negative photoresist is provided with a pattern formed within the layer of the negative photoresist in a border zone of the resist structure before it is irradiated, the pattern comprising a dimension or structural feature that is smaller than a minimal resolution of the irradiation, and wherein the pattern comprises a plurality of elements having the same dimensions.

2. The method of claim 1, wherein the pattern is provided as a sub-resolution assist feature.

3. The method of claim 1, further comprising:
at least one dimension characterizing the pattern, and a width of the border zone, the dimension of the pattern being smaller than one tenth of the width of the border zone.

4. The method of claim 1, wherein the dimensions of the elements are smaller than one tenth of a width of the border zone.

5. The method of claim 1, wherein the elements are arranged in a regular array with constant pitch.

6. The method of claim 5, wherein the pitch is smaller than one tenth of a width of the border zone.

7. The method of claim 1, wherein the pattern is a gridlike pattern.

8. The method of claim 1, wherein the pattern is a pattern of parallel lines.

9. The method of claim 1, wherein the pattern is a pattern of contact holes.

10. The method of claim 1, wherein the resist structure is produced with an undercut sidewall.

11. The method of claim 1, wherein the resist structure is produced as a lift-off mask.

12. A method of producing a resist structure, comprising:
applying a layer of a negative photoresist on a bottom layer, the layer of the negative photoresist being provided with a pattern formed within the layer of the negative photoresist in a border zone of an area provided for a resist structure;

irradiating a surface area of the layer of the negative photoresist according to the resist structure; and removing the layer of the negative photoresist outside the irradiated surface area, thus forming the resist structure with overhanging sidewall, wherein the pattern is formed within the layer of the negative photoresist in the border zone of the resist structure before it is irradiated, and wherein the pattern comprises a plurality of elements having the same dimensions.

* * * * *